United States Patent
Lee et al.

(10) Patent No.: US 7,528,656 B2
(45) Date of Patent: May 5, 2009

(54) PUSH-PULL AMPLIFIER AND METHOD FOR LOW NOISE AMPLIFICATION

(75) Inventors: Dong Hyun Lee, Anyang-si (KR); Heung Bae Lee, Suwon-si (KR); Ick Jin Kwon, Hwasung-si (KR); Ju No Kim, Seoul (KR); Ka Ram Ann, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 196 days.

(21) Appl. No.: 11/594,812

(22) Filed: Nov. 9, 2006

(65) Prior Publication Data
US 2007/0290754 A1 Dec. 20, 2007

(30) Foreign Application Priority Data
Jun. 15, 2006 (KR) .............. 10-2006-0053762

(51) Int. Cl.
*H03F 3/45* (2006.01)
(52) U.S. Cl. ............ 330/255; 330/69; 330/253; 330/302
(58) Field of Classification Search ............ 330/69, 330/253, 255, 302
See application file for complete search history.

(56) References Cited

U.S. PATENT DOCUMENTS

| 5,378,997 | A |  | 1/1995 | Sawyer |
|---|---|---|---|---|
| 6,118,340 | A |  | 9/2000 | Koen |
| 6,366,171 | B1 |  | 4/2002 | Litmanen et al. |
| 6,480,067 | B1 | * | 11/2002 | Kobayashi et al. ........ 330/254 |
| 6,590,422 | B1 | * | 7/2003 | Dillon ................ 330/253 |
| 2005/0052245 | A1 |  | 3/2005 | Rofougaran |

FOREIGN PATENT DOCUMENTS

| JP | 10-209773 A | 8/1998 |
|---|---|---|
| JP | 2001-077641 A | 3/2001 |
| WO | WO 2004/010576 A1 | 1/2004 |

* cited by examiner

*Primary Examiner*—Khanh V Nguyen
(74) *Attorney, Agent, or Firm*—Sughrue Mion PLLC

(57) ABSTRACT

Provided is an amplifier including: an amplifier circuit receiving differential signals to generate amplified differential signals; a buffer generating buffered signals by buffering each signal generated by controlling a direct current (DC) component of the differential signals; and an impedance matching device coupled between two terminals wherein each of the buffered signals is added with each of the amplified differential signal.

20 Claims, 7 Drawing Sheets

US 7,528,656 B2

PUSH-PULL AMPLIFIER AND METHOD FOR LOW NOISE AMPLIFICATION

CROSS-REFERENCE TO RELATED APPLICATIONS

This application claims priority from Korean Patent Application No. 10-2006-0053762, filed on Jun. 15, 2006, in the Korean Intellectual Property Office, the disclosure of which is incorporated herein by reference.

BACKGROUND OF THE INVENTION

1. Field of the Invention

Apparatuses and methods consistent with the present invention relate to a low noise amplifier (LNA), and more particularly, to a full differential LNA having a differential input and differential output structure and a method of using the same, capable of reducing noise figure, a design area, and power consumption.

2. Description of the Related Art

Currently, wireless devices such as a radio frequency ID (RFID) reader, a mobile phone, and a personal digital assistant (PDA) generally employ a direct conversion method instead of a super-heterodyne method, as an RF signal receiving method. Since an intermediate frequency is not used in the direct conversion method, components for a corresponding processing may be saved, thereby reducing cost, decreasing weight, and enabling a system on a chip. However, performance of a mixer used for directly converting a signal of a baseband into a carrier wave or converting a received RF signal into a signal of a baseband, in wireless devices, is deteriorated due to some signal distortion caused by second order intercept point (IP2). A low noise amplifier (LNA) amplifying a signal in front of the mixer has to be designed for reducing the above noise component IP2 as well as design area and power consumption.

FIG. 1 illustrates an example of a related art cascode amplifier 100. Referring to FIG. 1, the cascode amplifier 100 includes transistors M11, M12, M13, and M14 and inductors L11, L12, L13, and L14. The cascode amplifier 100 is a related art differential LNA in the structure of combining a common source and a common gate. In FIG. 1, an input impedance of input differential signal terminals IN_P and IN_N, output impedances of terminals of output differential signals OUT_P and OUT_N, and a gain are determined depending on load inductors L11 and L12, degeneration inductors L13 and L14, and bias voltage VB.

However, while it is known as the cascode amplifier 100 reuses current and has certain stability, it is difficult to acquire a low-Q since the input impedance and the output impedance are high, and therefore impedance matching is not simple, and it is difficult to expand an operational bandwidth.

FIG. 2 illustrates an example of a related art push-pull amplifier 200. Referring to FIG. 2, the push-pull amplifier 200 includes transistors M21 and M22 and inductors L21 and L22. In the push-pull amplifier 200, an N-channel metal-oxide-semiconductor field effect transistor (MOSFET) M21 and a P-channel MOSFET M22 perform complementary operations and an input impedance of an input signal (LNA_IN) terminal, an output impedance of an output signal LNA_OUT terminal, and a gain are determined depending on transconductance of the transistors M21 and M22.

However, while the push-pull amplifier 200 has certain high power efficiency and the low input impedance, the output impedance is high. Accordingly, in the push-pull amplifier 200, an impedance matching as well as a low-Q is not easy at the output terminal, and it is difficult to expand an operational bandwidth.

SUMMARY OF THE INVENTION

Exemplary embodiments of the present invention overcome the above disadvantages and other disadvantages not described above. Also, the present invention is not required to overcome the disadvantages described above, and an exemplary embodiment of the present invention may not overcome any of the problems described above.

An aspect of the present invention provides a full-differential LNA and a method of using the same, capable of reducing a design area by reducing a number of impedance matching devices, for example, inductors, reducing power consumption by employing a push-pull structure, easily implementing a low input/output impedance matching, for example, 50 Ω matching required in a wireless system, and reducing some signal distortion caused by IP2.

According to an aspect, of the present invention, there is provided an amplifier including: an amplifier circuit which receives input differential signals and generates amplified differential signals; a buffer which buffers the input differential signals by controlling a direct current (DC) component of each of the differential signals; and an impedance matching device coupled between two terminals wherein each of the buffered signals is added with each of the amplified differential signals.

The amplifier may further include: a first capacitor coupled between a terminal of a first signal of the differential signals and a first input terminal of the buffer to control a DC component of the first signal; and a second capacitor coupled between a terminal of a second signal of the differential signals and a second input terminal of the buffer to control a DC component of the second signal. A first DC bias may be applied to the first input terminal, and a second DC bias may be applied to the second input terminal. The first DC bias may be a voltage substantially identical with the second DC bias.

The impedance matching device may include at least one of an inductor, a capacitor, and a resistor.

According to another aspect of the present invention, there is provided an amplifier including: two input transistors which receive differential signals; and two source follower transistors which receive signals generated by controlling a DC component of each of the differential signals and generates differential output signals via two contact points connected to the two input transistors, wherein input and output impedances are controlled by a component for impedance matching coupled between the two contact points.

According to still another aspect of the present invention, there is provided an amplifier including: two first transistors, which receive original first differential signals; two second transistors, which receive second differential signals generated by controlling a DC component of each of the original first differential signals by capacitors; and an impedance matching device coupled between two contact points in which the two first transistors are connected to the two second transistors, wherein differential output signals are generated from the two contact points.

According to yet another aspect of the present invention, there is provided an amplifier including: a first transistor which receive a first input signal; a second transistor which receive a second input signal; a third transistor which receive a first signal generated by controlling a DC component of the first input signal and generates a first output signal from a contact point connected to the second transistor; a fourth transistor which receives a second signal generated by controlling a DC component of the second input signal and generates a second output signal from a contact point connected to the first transistor; and a first inductor coupled between a terminal of the first output signal and a terminal of the second output signal. The first inductor may be a differential inductor patterned in a symmetrical strip line structure between two terminals.

A gate of the first transistor may receive the first input signal, a gate of the fourth transistor may receive the second signal, and one of a source and a drain of the first transistor may be connected to one of a source and a drain of the fourth transistor.

A gate of the second transistor may receive the second input signal, a gate of the third transistor may receive the first signal, and one of a source and a drain of the second transistor may be connected to one of a source and a drain of the third transistor.

The amplifier may further include: a second inductor coupled between another of the source and the drain of the first transistor and a first power; and a third inductor coupled between another of the source and the drain of the second transistor and the first power.

A second power may be connected to another of the source and the drain of the third transistor and another of the source and the drain of the fourth transistor, and the first power may have a voltage smaller than the second power.

The amplifier may further include: a first capacitor coupled between a terminal of the first input signal and a terminal of the third transistor which receives the first signal, and transfers the first signal to the third transistor; and a second capacitor coupled between a terminal of the second input signal and a terminal of the fourth transistor which receives the second signal, and transfers the second signal to the fourth transistor.

A first DC bias may be applied, to the terminal of the third transistor which receives the first signal, and a second DC bias may be applied to the terminal of the fourth transistor which receives the second signal. In this case, the first DC bias may be a voltage substantially identical with the second DC bias.

The first transistor, the second transistor, the third transistor, and the fourth transistor may be any one of an N-channel MOSFET and a P-channel MOSFET.

The first input signal and the second input signal may comprise first differential signals, and the first output signal and the second output signal may be second differential signals.

The amplifier may be utilized for amplifying an input signal of a mixer for frequency down-conversion in frequency direct conversion.

According to a further aspect of the present invention, there is provided a signal amplification method of an amplifier, the method including: receiving a first input signal and a second input signal; generating a first signal by controlling a DC component of the first input signal and generating a second signal by controlling a DC component of the second input signal; and generating a first output signal from the first signal by using a first source follower and generating a second output signal from the second signal by using a second source follower, wherein input and output impedances are controlled by a component for impedance matching between a terminal of the first output signal and a terminal of the second output signal.

BRIEF DESCRIPTION OF THE DRAWINGS

The above and/or other aspects of the present invention will become apparent and more readily appreciated from the following detailed description, taken in conjunction with the accompanying drawings of which.

DETAILED DESCRIPTION OF EXEMPLARY EMBODIMENTS OF THE INVENTION

Figure 1:
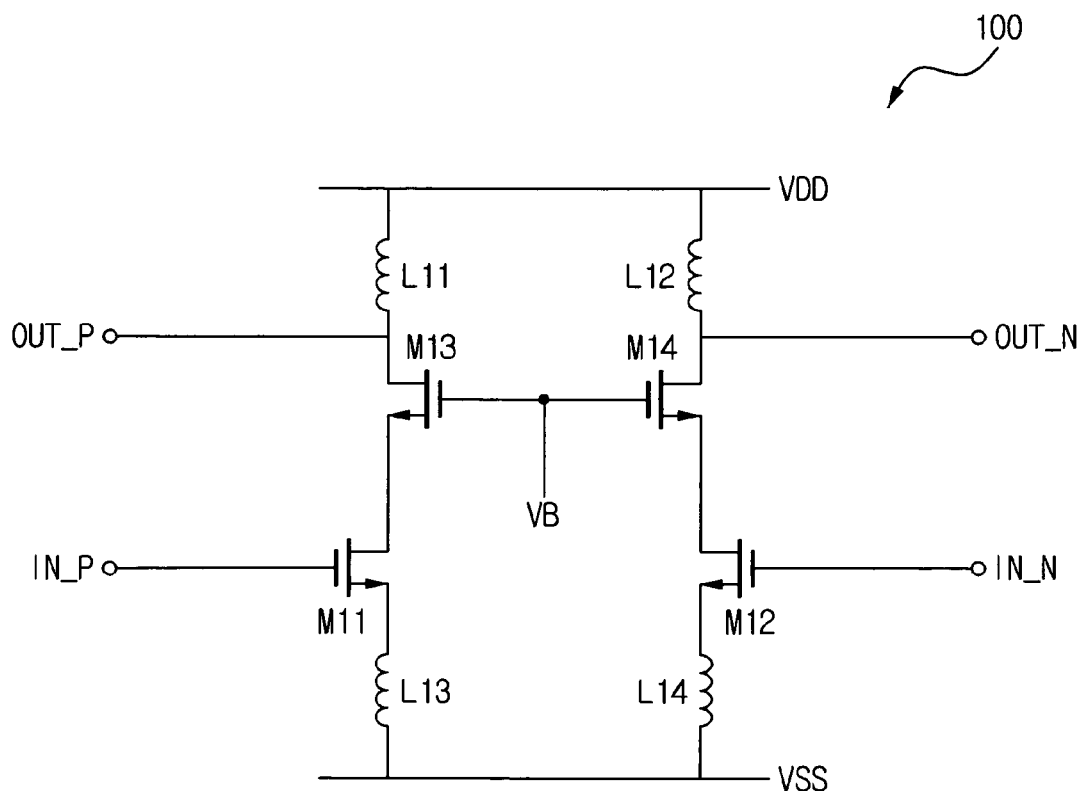
FIG. 1 illustrates an example of a related art differential cascode amplifier.

Reference will now be made in detail to the exemplary embodiments of the present invention, examples of which are illustrated in the accompanying drawings, wherein like reference numerals refer to like elements throughout. The exemplary embodiments are described below to explain the present invention by referring to the figures.

Figure 3:
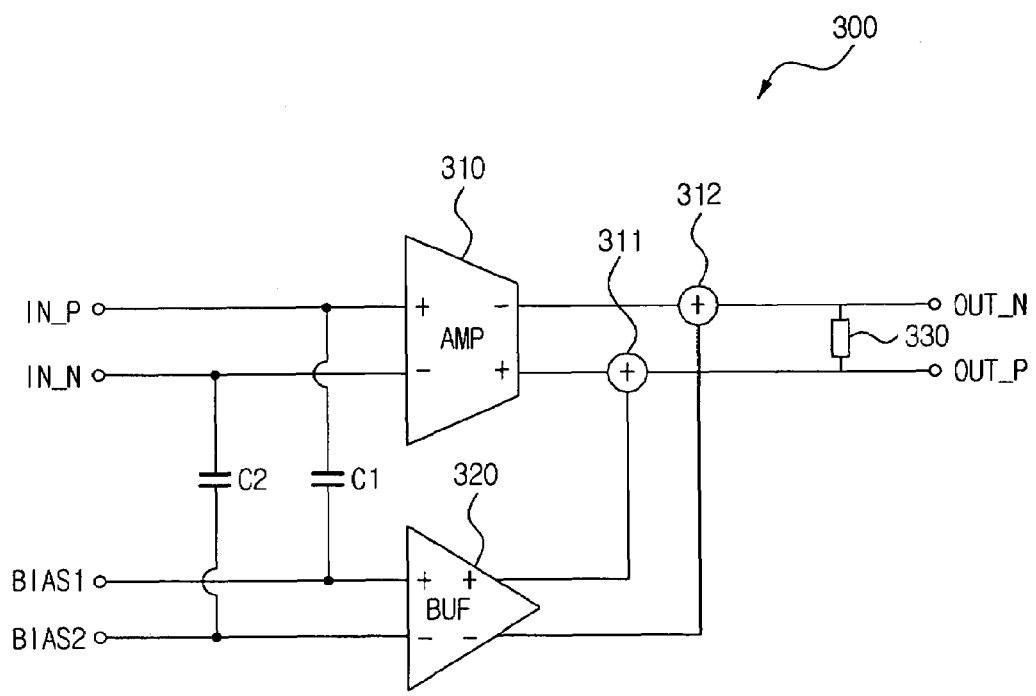
FIG. 3 is a block diagram illustrating a push-pull low noise amplifier (LNA) according to an exemplary embodiment of the present invention.

FIG. 3 is a block diagram illustrating a push-pull low noise amplifier 300 according to an exemplary embodiment of the present invention. Referring to FIG. 3, the amplifier 300 comprises an amplification circuit 310, a buffer 320, a first capacitor C1, a second capacitor C2, and impedance matching device 330.

The amplification circuit 310 receives differential signals IN_P and IN_N and generates amplified differential signals. The differential signals IN_P and IN_N have 180 degree phase difference from each other.

The first capacitor C1 is coupled between a terminal of the first signal IN_P and a "+" input terminal of the buffer 320 to control a direct current (DC) component of a first signal IN_P from the differential signals IN_P and IN_N. The second capacitor C2 is coupled between a terminal of the second signal IN_N and a "−" input terminal of the buffer 320 to control the DC component of a second signal IN_N from the differential signals IN_P and IN_N. Capacitance values of the first capacitor C1 and the second capacitor C2 may be substantially identical with each other.

To make DC levels of a signal passing through the first capacitor C1 and a signal passing through the second capacitor C2 to be approximately identical with each other, a first DC bias BIAS1 is applied to the "+" input terminal of the buffer 320, and a second DC bias BIAS2 is applied to the— input terminal of the buffer 320. The first DC bias BIAS1 may be a voltage substantially identical with the second DC bias BIAS2.

Accordingly, the buffer 320 buffers signals by controlling the DC component of the differential signals IN_P and IN_N.

Each of the buffered signals generated by the buffer 320 is added with each of the amplified differential signals generated by the amplification circuit 310, having the same phase. In this case, while it is shown that summation of signals is performed by summation units 311 and 312, as shown in FIG. 3, the summation of the signals may be performed by connecting terminals outputting each signal.

The impedance matching device 330 is coupled between signal terminals in which each of the buffered signals is added to each of the amplified differential signals. Differential output signals OUT_P and OUT_N are generated from both terminals of the impedance matching device 330. The impedance matching device 330 may include at least one of an inductor, a capacitor, and a resistor.

Particularly, in the present invention, a number of devices used as the impedance matching device 330 for impedance matching is reduced to reduce a design area. As described below, the impedance matching device 330 may be particularly embodied as an inductor, thereby easily matching a small input/output impedance such as 50 Ω. An impedance of 50 Ω is required in wireless devices such as an RFID reader, a mobile phone, and a PDA. An inductor used as the impedance matching device 330 according to the present invention is embodied as a differential inductor. The differential inductor is a device patterned in a symmetrical strip line structure between two terminals. The differential inductor may be embodied by a mirror arrangement of two general asymmetrical inductors in serial.

Together with the above features, an aspect of the present invention provides a full-differential LNA reducing power consumption by employing a push-pull structure and reducing a noise figure.

Figure 4:
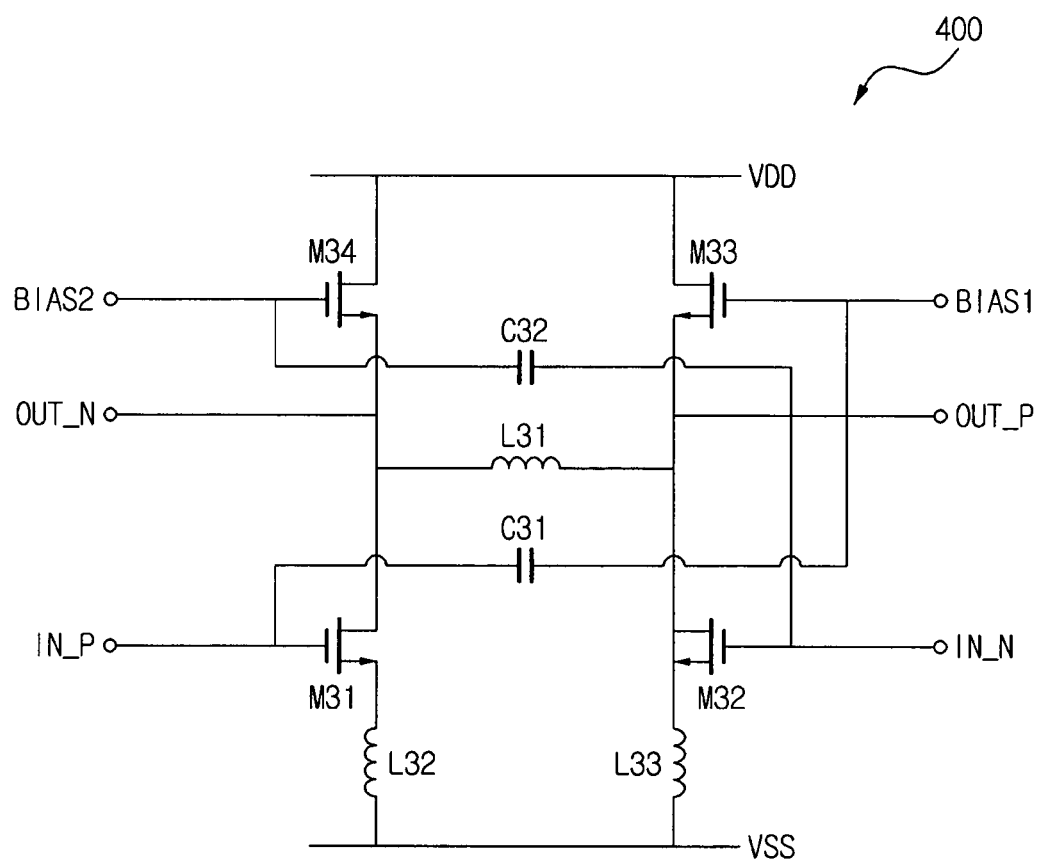
FIG. 4 is a diagram illustrating a detailed example of a circuit of the push-pull LNA of FIG. 3.

FIG. 4 is a diagram illustrating a detailed example of a circuit 400 of the push-pull LNA 300 of FIG. 3. Referring to FIG. 4, the circuit 400 includes input transistors M31 and M32 and source follower transistors M33 and M34 generating differential output signals OUT_P and OUT_N via two contact points connected to the input transistors M31 and M32. In addition, the circuit 400 includes a first capacitor C31, a second capacitor C32, a first inductor L31, a second inductor L32, and a third inductor L33.

As shown in FIG. 4, the circuit 400 has a push-pull structure of merging a common source form and a source follower form. In the above push-pull structure, since the source follower transistors M33 and M34 reuse a current used by the input transistors M31 and M32 and complementarily operate with the input transistors M31 and M32, power consumption may be reduced.

In the present invention, to reduce a design area, a number of used inductors is reduced. Namely, due to an inductance component of the first inductor L31 coupled between the contact points in which the input transistors M31 and M32 are connected to the source follower transistors M33 and M34, matching of an input impedance and matching of an output impedance are easily performed at a small impedance of 50 Ω. The inductance component of the first inductor L31 may affect gain. As described above, the first inductor L31 corresponds to the impedance matching device 330 of FIG. 3 and is the differential inductor patterned in a symmetrical strip line between two terminals of the first inductor L31. The structure of the differential inductor is used for acquiring a substantially identical signal effect in both directions of the first inductor L31.

In FIG. 4, a gate of the first input transistor M31 receives a first input signal IN_P from the differential signals IN_P and IN_N and a gate of the second input transistor M32 receives a second input signal IN_N from the differential signals IN_P and IN_N. The inductors L32 and L33 that are inductive degeneration devices are coupled between one of source/drain of the first input transistor M31 and the second input transistor M32 and a first power VSS. Depending on control of inductance values of the inductors L32 and L33, linearity of an amplifier input/output feature may be improved and the matching of the input impedance and the matching of the output impedance are affected. A circuit including the input transistors M31 and M32 or a circuit including the input transistors M31 and M32 and the inductors L32 and L33 corresponds to the amplification circuit 310 of FIG. 3. A circuit including the source follower transistors M33 and M34 corresponds to the buffer 320 of FIG. 3.

The first capacitor C31 is coupled between a terminal of the first input signal IN_P and a gate of the first source follower transistor M33. The first capacitor C31 controls a DC component of the first input signal IN_P and transfers the signal generated by controlling the DC component to the gate of the first source follower transistor M33.

The second capacitor C32 is coupled between a terminal of the second input signal IN_N and a gate of the second source follower transistor M34. The second capacitor C32 controls a DC component of the second input signal IN_N and transfers the signal generated by controlling the DC component to the gate of the second source follower transistor M34.

To make DC levels of the signal passing through the first capacitor C31 and the signal passing through the second capacitor C32 identical with each other, a first DC bias BIAS1 is applied to the gate of the first source follower transistor M33 and a second DC bias BIAS2 is applied to the gate of the second source follower transistor M34. When the DC levels of the signal passing through the first capacitor C31 and the signal passing through the second capacitor C32 are identical with each other, the first DC bias BIAS1 and the second DC bias BIAS2 may be voltages substantially identical with each other. The capacitors C31 and C32 correspond to the capacitors C1 and C2 of FIG. 3.

In this case, another of the source/drain of the second input transistor M32 is connected to one of source/drain of the first source follower transistor M33 at a first contact point, and a first output signal OUT_P is generated from the first contact point. Also, another of the source/drain of the first input transistor M31 is connected to one of a source/drain of the second source follower transistor M34 at a second contact point and a second output signal OUT_P is generated from the second contact point. The first inductor L31 is coupled between the first contact point and the second contact point. Another of the source/drain of the first source follower transistor M33 is connected to a second power VDD. Another of the source/drain of the second source follower transistor M34 is also connected to the second power VDD.

In the circuit 400 having the above structure, each of the input transistors M31 and M32 receive the differential signals IN_P and IN_N and each of the source follower transistors M33 and M34 receive differential signals generated by controlling a respective DC component of the original differential signals IN_P and IN_N by the capacitors C31 and C32 or the DC. bias BIAS1 and BIAS2. Namely, when the DC components of the original differential signals IN_P and IN_N are controlled by the capacitors C31 and C32 or the DC bias BIAS1 and BIAS2, a first signal generated by controlling the DC component of the first input signal IN_P and a second signal generated by controlling the DC component of the second input signal IN_N comprise an alternating current (AC) component. The AC components have a differential signal relation such as a 180 degree phase difference from each other.

In the circuit 400, when the first input transistor M31 receives the first input signal IN_P and the second input transistor M32 receives the second input signal IN_N, the first signal generated by controlling the DC component of the first input signal IN_P and the second signal generated by controlling the DC component of the second input signal IN_N by the capacitors C31 and C32 or the DC bias BIAS1 and BIAS2 may be generated. Accordingly, the first signal is applied to the first source follower transistor M33 and the first source follower transistor M33 generates the first output signal OUT_P having a phase identical with the first input signal IN_P via the first contact point in which the first source follower transistor M33 is connected to the second input transistor M32. Also, the second signal is applied to the second source follower transistor M34 and the second source follower transistor M34 generates the second output signal OUT_N having a phase identical with the second input signal IN_N via the second contact point in which the second source follower transistor M34 is connected to the first input transistor M31.

In the push-pull LNA shown in FIG. 4, while the input transistors M31 and M32 and the source follower transistors M33 and M34 are shown as an N-channel MOSFETs, the present invention is not limited to this and the input transistors M31 and M32 and the source follower transistors M33 and M34 may be P-channel MOSFETs. In the circuit 400, when the input transistors M31 and M32 and the source follower transistors M33 and M34 are formed of P-channel MOSFETs, the first power VSS has to be a greater value than the second power VDD. For example, in a P-channel MOSFET structure, conversing to power supply in an N-channel MOSFET structure, the first power VSS may be 5 volts and the second power VDD may be 0 volts, i.e., ground.

Amplitude of capacitance components of the capacitors C31 and C32 may be suitably selected depending on sizes of the input transistors M31 and M32 and the source followers M33 and M34. Also, input impedance and output impedance may be controlled by the inductance component of the first inductor L31 coupled between a terminal of the first output signal OUT_P and a terminal of the second output signal OUT_N as well as transconductance of the input transistors M31 and M32 and the source follower transistors M33 and M34. Accordingly, for matching of the input impedance or matching of the output impedance, a value of the inductance component of the first inductor L31 and the sizes of the input transistors M31 and M32 and the source follower transistors M33 and M34 may be suitably selected.

Figure 2:
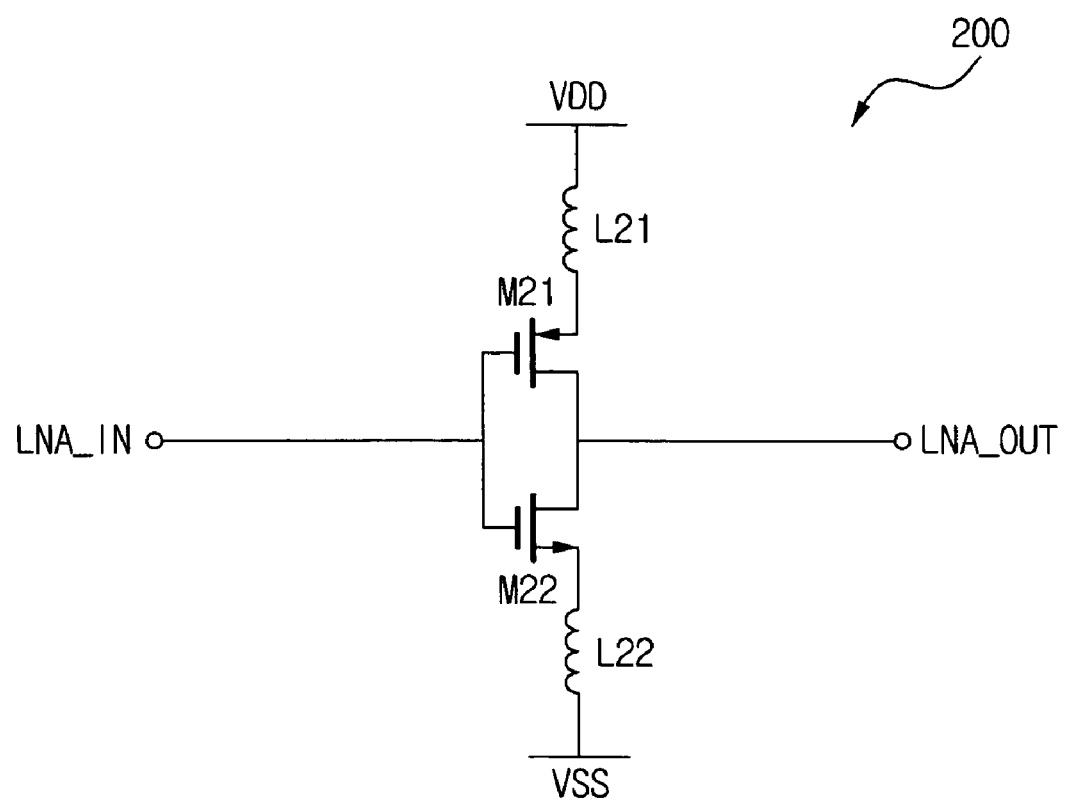
FIG. 2 illustrates an example of a related art differential push-pull amplifier.

Also, in the present invention, any one of the input transistors M31 and M32, for example, the input transistor M31, and any one of the source follower transistors M33 and M34, for example, the first source follower transistor M33 receive any one of the differential signals IN_P and IN_N, for example, the first differential signal IN_P in parallel, thereby decreasing an input impedance. Also, since output impedances in terminals of the output signals OUT_P and OUT_N, caused by the source follower transistors M33 and M34, is small, total output impedances may be decreased in association with the input transistors M31 and M32. Thus, according to an aspect of the present invention, there is provided a structure capable of decreasing the input impedance and the output impedance rather than the amplifier of FIG. 1 or 2, and matching impedance at low-Q, for example, matching of 50 Ω may be easily performed and operation bandwidth may be broadened.

Hereinafter, a simulation verification result with respect to the circuit 400 of FIG. 4 will be described referring to FIGS. 5 through 7.

Figure 5:
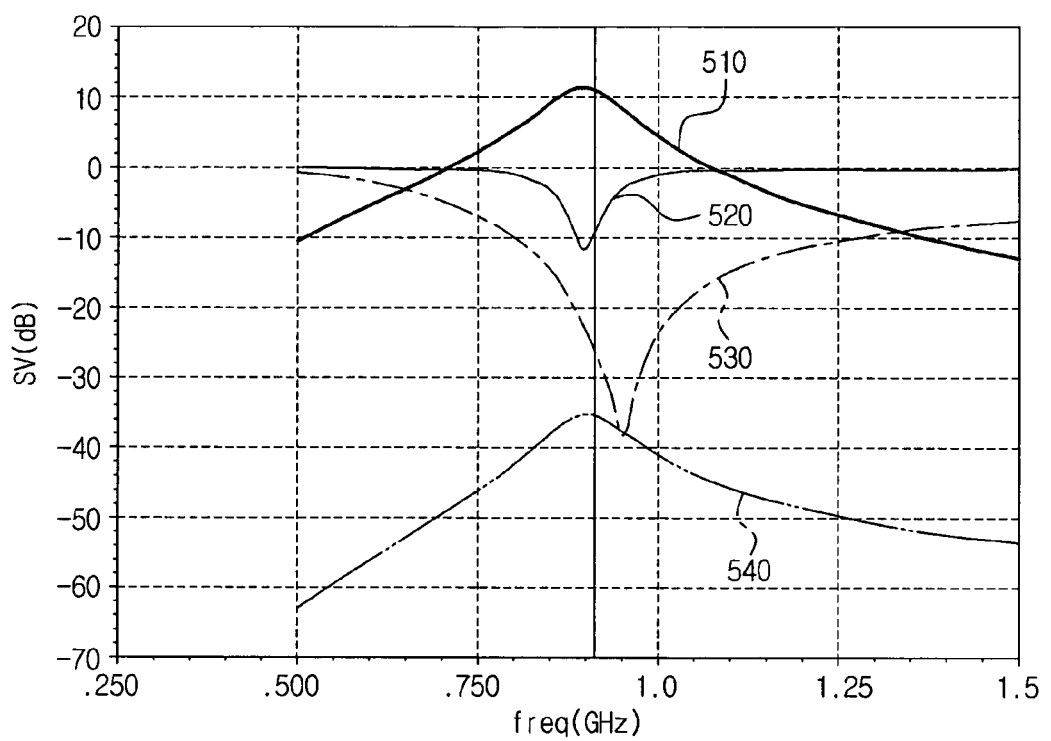
FIG. 5 is a graph illustrating an S-parameter of the push-pull LNA of FIG. 4.

FIG. 5 illustrates curves 510, 520, 530, and 540 indicating a relation of an S-parameter value SV versus an operation frequency of the circuit 400 of FIG. 4. In FIG. 5, there is shown a simulation result by matching the input and output of the circuit 400 with an input impedance and output impedance of 50 Ω. As the curve 510 indicating a transmission coefficient S21, the transmission coefficient S21 is excellent as 10.8 dB in a target frequency 910 MHz. As the curve 520 indicating an input side reflection coefficient S11, the input side reflection coefficient S11 is shown as weak as −10.4 dB in the target frequency 910 MHz. As the curve 530 indicating an output side reflection coefficient S22, the output side reflection coefficient S22 is shown as weak as −35.6 dB in the target frequency 910 MHz. As the curve 540 indicating a reverse flow coefficient S12, the reverse flow coefficient S12 is shown as small as −35.6 dB in the target frequency 910 MHz. Namely, the transmission coefficient S21 is very great and other coefficients are very small. Accordingly, the circuit 400 is expected to show an excellent amplification performance even in a broadband.

Figure 6:
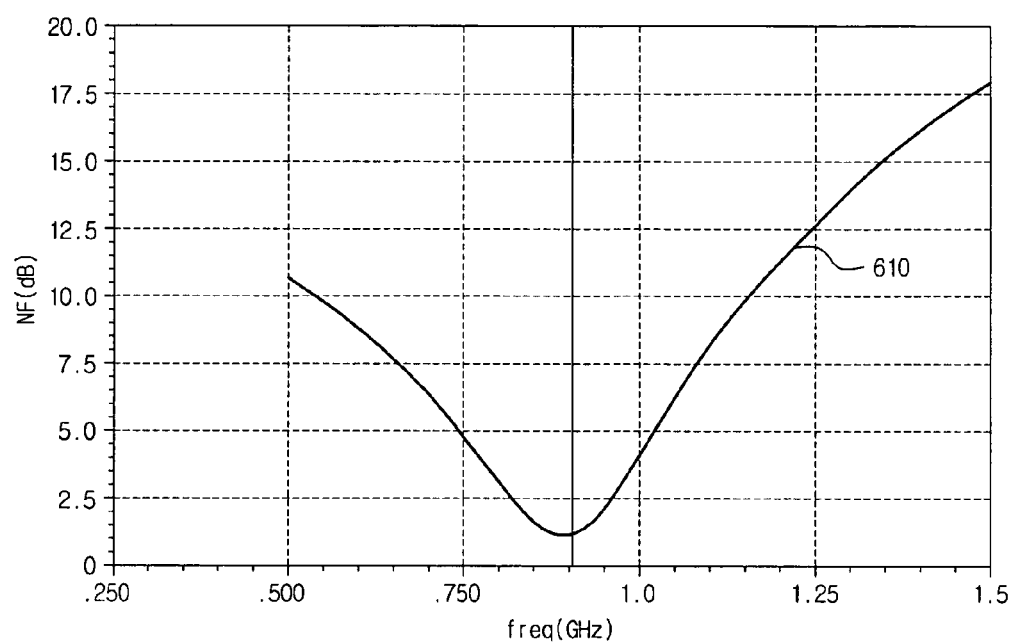
FIG. 6 is a graph illustrating a noise figure of the push-pull LNA of FIG. 4.

FIG. 6 illustrates a curve 610 indicating a relation of a noise figure versus the operation frequency of the circuit 400 of FIG. 4. The noise figure is a log value with respect to a rate of a signal-to-noise ratio (SNR) of an input side to an SNR of an output side and is shown as very small as 1.21 dB in the target frequency 910 MHz, as shown by the curve 610. Accordingly, the circuit 400 is expected to show an excellent amplification performance while reducing an effect of noise when amplifying an input signal of a mixer for frequency down conversion in an RF receiver.

Figure 7:
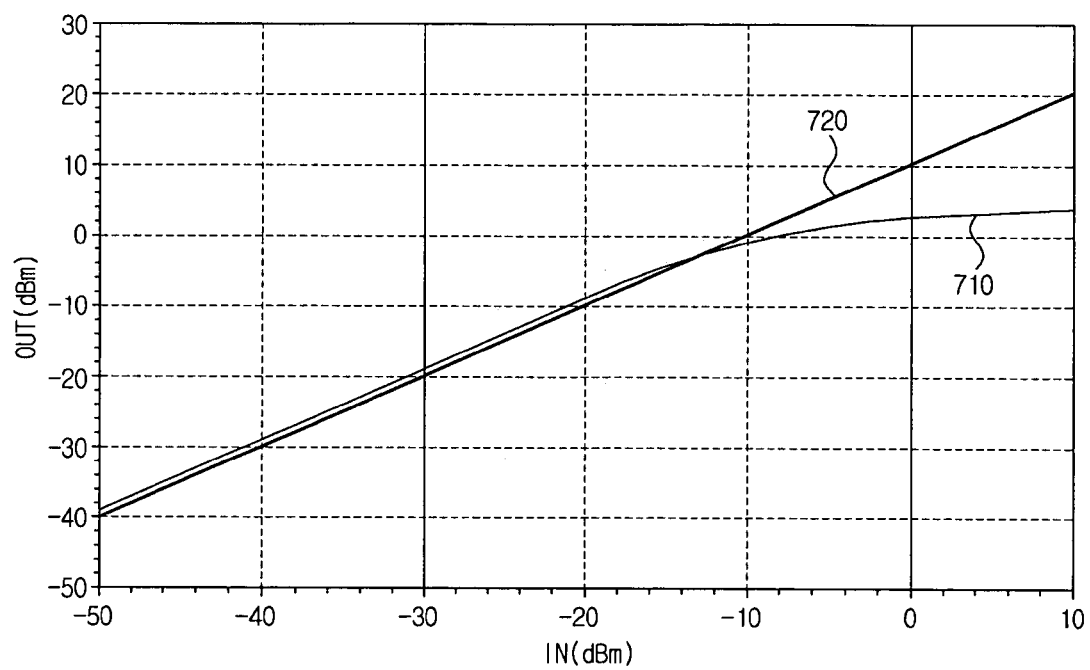
FIG. 7 is a graph illustrating a 1 dB gain compression point of the push-pull LNA of FIG. 4.

FIG. 7 illustrates curves 710 and 720 indicating a relation of an output signal power OUT versus an input signal power IN of the circuit 400 of FIG. 4. The curve 710 indicates a case of the circuit 400, and the curve 720 indicates a curve with 1 dB less output power than a linear domain of the curve 710. Namely, a crossing of the curve 710 and the curve 720 indicates a 1 dB gain compression point (IP1 dB). As the curve 710, the circuit 400 indicates IP1 dB around the input signal power −12.8 dBm. Accordingly, since the circuit 400 shows excellent linearity in a broad domain such as the input signal power −13 dBm, it is expected to reduce signal distortion and to show excellent amplification performance.

As described above, in the full-differential LNA and the method of using the same according to the present exemplary embodiment, a designed area may be reduced by reducing a number of inductors for impedance matching, and power consumption may be reduced by employing a push-pull structure.

Also, in the LNA and the method of using the same according to the present invention, input/output impedance is small, thereby easily matching 50 Ω impedances in low-Q and broadening an operation bandwidth.

Also, in the LNA and the method of using the same according to the present invention, since a full-differential structure in the form of a push-pull is used, IP2 performance is improved, thereby usefully applied to a receiver for directly converting an RF signal.

Although a few exemplary embodiments of the present invention have been shown and described, the present invention is not limited to the described exemplary embodiments. Instead, it would be appreciated by those skilled in the art that changes may be made to these exemplary embodiments without departing from the principles and spirit of the invention, the scope of which is defined by the claims and their equivalents.

What is claimed is:

1. An amplifier comprising:
an amplifier circuit which receives input differential signals and generates amplified differential signals;
a buffer which buffers the input differential signals by controlling a direct current (DC) component of the input differential signals; and
an impedance matching device coupled between two terminals wherein each of the buffered signals is added with each of the generated amplified differential signals,
wherein the impedance matching device comprises an inductor patterned in a symmetrical strip line structure.

2. The amplifier of claim 1, further comprising:
a first capacitor coupled between a terminal of a first signal of the differential signals and a first input terminal of the buffer to control a DC component of the first signal; and
a second capacitor coupled between a terminal of a second signal of the differential signals and a second input terminal of the buffer to control a DC component of the second signal.

3. The amplifier of claim 2, wherein:
a first DC bias is applied to the first input terminal; and
a second DC bias is applied to the second input terminal.

4. The amplifier of claim 3, wherein the first DC bias comprises a voltage substantially identical with the second DC bias.

5. The amplifier of claim 1, wherein the impedance matching device comprises at least one of an inductor, a capacitor, and a resistor.

6. An amplifier comprising:
two input transistors receiving differential signals; and
two source follower transistors receiving signals generated by controlling a DC component of each of the differential signals and generates differential output signals via two contact points connected to the two input transistors,
wherein input and output impedances are controlled by a component for impedance matching coupled between the two contact points, and
wherein the component for impedance matching comprises a differential inductor patterned in a symmetrical strip line structure.

7. An amplifier comprising:
two first transistors which receive original first differential signals;
two second transistors which receive second differential signals generated by controlling a DC component of each of the original first differential signals by capacitors; and
an impedance matching device coupled between two contact points in which the two first transistors are connected to the two second transistors,
wherein differential output signals are generated from the two contact points, and
wherein the impedance matching device comprises a differential inductor patterned in a symmetrical strip line structure.

8. An amplifier comprising:
a first transistor which receives a first input signal;
a second transistor which receives a second input signal;
a third transistor which receives a first signal generated by controlling a DC component of the first input signal and generates a first output signal from a contact point connected to the second transistor;
a fourth transistor which receives a second signal generated by controlling a DC component of the second input signal and generates a second output signal from a contact point connected to the first transistor; and
a first inductor coupled between a terminal of the first output signal and a terminal of the second output signal,
wherein the first inductor comprises a differential inductor patterned in a symmetrical strip line structure.

9. The amplifier of claim 8, wherein:
a gate of the first transistor receives the first input signal, a gate of the fourth transistor receives the second signal, and one of a source and a drain of the first transistor is connected to one of a source and a drain of the fourth transistor; and
a gate of the second transistor receives the second input signal, a gate of the third transistor receives the first signal, and one of a source and a drain of the second transistor is connected to one of a source and a drain of the third transistor.

10. The amplifier of claim 9, further comprising:
a second inductor coupled between another of the source and the drain of the first transistor and a first power; and
a third inductor coupled between another of the source and the drain of the second transistor and the first power,
wherein the another of the source and the drain of the first transistor is different from the one of a source and a drain of the first transistor connected to one of a source and a drain of the fourth transistor, and
wherein the another of the source and the drain of the second transistor is different from the one of a source and a drain of the second transistor connected to one of a source and a drain of the third transistor.

11. The amplifier of claim 10, wherein:
a second power is connected to another of the source and the drain of the third transistor and another of the source and the drain of the fourth transistor; and
the first power has a voltage smaller than the second power,
wherein the another of the source and the drain of the third transistor is different from the one of a source and a drain of the third transistor connected to one of a source and a drain of the second transistor, and
wherein the another of the source and the drain of the fourth transistor is different from the one of a source and a drain of the fourth transistor connected to one of a source and a drain of the first transistor.

12. The amplifier of claim 10, wherein:
a second power is connected to another of the source and the drain of the third transistor and another of the source and the drain of the fourth transistor; and
the first power has a voltage greater than the second power,
wherein the another of the source and the drain of the third transistor is different from the one of a source and a drain of the third transistor connected to one of a source and a drain of the second transistor, and
wherein the another of the source and the drain of the fourth transistor is different from the one of a source and a drain of the fourth transistor connected to one of a source and a drain of the first transistor.

13. The amplifier of claim 8, further comprising:
a first capacitor coupled between a terminal of the first input signal and a terminal of the third transistor which receives the first signal, and transfers the first signal to the third transistor; and
a second capacitor coupled between a terminal of the second input signal and a terminal of the fourth transistor which receives the second signal, and transfers the second signal to the fourth transistor.

14. The amplifier of claim 13, wherein:
a first DC bias is applied to the terminal of the third transistor which receives the first signal; and
a second DC bias is applied to the terminal of the fourth transistor which receives the second signal.

15. The amplifier of claim 14, wherein the first DC bias comprises a voltage substantially identical with the second DC bias.

16. The amplifier of claim 8, wherein the first transistor, the second transistor, the third transistor, and the fourth transistor are N-channel metal oxide semiconductor field-effect transistors (MOSFETs).

17. The amplifier of claim 8, wherein the first transistor, the second transistor, the third transistor, and the fourth transistor are P-channel MOSFETs.

18. The amplifier of claim 8, wherein:
the first input signal and the second input signal comprise first differential signals; and
the first output signal and the second output signal comprise second differential signals.

19. The amplifier of claim 8, wherein the amplifier amplifies an input signal of a mixer for frequency down-conversion in frequency direct conversion.

20. A signal amplification method of an amplifier, the method comprising:
receiving a first input signal and a second input signal;
generating a first signal by controlling a DC component of the first input signal and generating a second signal by controlling a DC component of the second input signal; and
generating a first output signal from the first signal by using a first source follower and generating a second output signal from the second signal by using a second source follower,
wherein input and output impedances are controlled by a component for impedance matching between a terminal of the first output signal and a terminal of the second output signal,
wherein the component for impedance matching is a differential inductor patterned in a symmetrical strip line structure.

* * * * *